United States Patent [19]

Riseman

[11] 4,234,362
[45] Nov. 18, 1980

[54] METHOD FOR FORMING AN INSULATOR BETWEEN LAYERS OF CONDUCTIVE MATERIAL

[75] Inventor: Jacob Riseman, Poughkeepsie, N.Y.

[73] Assignee: International Business Machines Corporation, Armonk, N.Y.

[21] Appl. No.: 957,606

[22] Filed: Nov. 3, 1978

[51] Int. Cl.$^3$ .................. H01L 21/22; H01L 21/306
[52] U.S. Cl. .................................. 148/187; 29/571; 29/578; 29/580; 148/174; 156/643; 156/657; 156/662; 204/192 E; 357/24; 357/59
[58] Field of Search .............. 156/643, 657, 653, 662; 29/571, 578, 580; 204/192 E; 148/187, 174; 357/24, 43, 59

[56] References Cited

U.S. PATENT DOCUMENTS

| | | | |
|---|---|---|---|
| 3,750,268 | 8/1973 | Wang | 29/571 |
| 3,943,543 | 3/1976 | Caywood | 357/24 |
| 3,966,577 | 6/1976 | Hochberg | 204/192 E |
| 3,984,822 | 10/1976 | Simko et al. | 357/23 |
| 3,996,657 | 12/1976 | Simko et al. | 357/23 |
| 3,996,658 | 12/1976 | Takei et al. | 29/578 |
| 4,031,608 | 6/1977 | Togei et al. | 29/571 |
| 4,072,545 | 2/1978 | De La Moneda | 357/59 |
| 4,074,300 | 2/1978 | Sakei et al. | 357/59 |
| 4,080,719 | 3/1978 | Wilting | 29/571 |
| 4,097,885 | 6/1978 | Walsh | 357/24 |
| 4,104,090 | 8/1978 | Pogge | 156/657 |
| 4,157,269 | 6/1979 | Ning et al. | 357/59 |
| 4,174,251 | 11/1979 | Paschke | 156/643 |

OTHER PUBLICATIONS

Gdula et al., "CCD . . . Polysilicon", *IBM Technical Disclosure Bulletin*, vol. 21, No. 5, (10/78), pp. 1865–1866.
Chang et al., "Transistor . . . Metal", *IBM Technical Disclosure Bulletin*, vol. 21, No. 2 (7/78), pp. 578–579.
Deines et al., "Process . . . Geometries", *IBM Technical Disclosure Bulletin*, vol. 21, No. 9 (2/79), pp. 3628–3629.
Abbas et al., "Extending . . . Processing ", *IBM Technical Disclosure Bulletin*, vol. 20, No. 4 (9/77), pp. 1376–1378.
Pogge, "Narrowline . . . Method", *IBM Technical Disclosure Bulletin*, vol. 6 (11/76), p. 2354.
Bersin, "A Survey . . . Processes", *Solid State Technology* (5/76), pp. 31–36.
Critchlow, "High Speed . . . Lithography", vol. 9, No. 2 (2/76), pp. 31–37.

*Primary Examiner*—Jerome W. Massie
*Attorney, Agent, or Firm*—George O. Saile

[57] ABSTRACT

A method for forming an insulator between conductive layers, such as highly doped polycrystalline silicon, that involves first forming a conductive layer of, for example, polycrystalline silicon on a silicon body having substantially horizontal and substantially vertical surfaces. A conformal insulator layer is formed on the substantially horizontal and substantially horizontal and vertical surfaces. Reactive ion etching removes the insulator from the horizontal layer and provides a narrow dimensioned insulator on the vertical surfaces silicon body. Another conductive layer, which may be polycrystalline silicon, is formed over the insulator. The vertical layer dimension is adjusted depending upon the original thickness of the conformal insulator layer applied.

23 Claims, 13 Drawing Figures

METHOD FOR FORMING AN INSULATOR BETWEEN LAYERS OF CONDUCTIVE MATERIAL

TECHNICAL FIELD

This invention relates to methods for forming highly dense and very small, integrated semiconductor devices, and more particularly, to forming a narrow dimensioned vertical insulator region between two conductive layers which may be composed of polycrystalline silicon.

CROSS-REFERENCES TO RELATED PATENT APPLICATIONS (1) Patent application Ser. No. 957,604 filed Nov. 3, 1978 entitled, "Method for Forming a Narrow Dimensioned Region on a Body" by H. B. Pogge.

(2) Patent application Ser. No. 957,605 filed Nov. 3, 1978 entitled, "Method for Forming a Narrow Dimensioned Mask" by I. T. Ho and J. Riseman.

(3) Patent application Ser. No. 957,559 filed Nov. 3, 1978 entitled, "Method for Forming Diffusions Through Narrow Dimensioned Openings Into a Body" by I. T. Ho and J. Riseman.

BACKGROUND ART

There has been a dramatic increase in the complexity of silicon integrated circuits over the past ten years. As applications develop for microprocesses and minicomputers there is an increasing demand for greater complexities, higher switching speeds, and smaller devices in the integrated circuit. The major technology in the semiconductor process which allows this increase complexity of integrated circuits is the lithographic technology. Over the past few years only modest reductions in line widths were achieved. It has been the photolithographic defect level reductions which have allowed the high levels of integration to be achieved. There has been a gradual decrease in line widths from about 5 to 10 micrometers to about 3 to 5 micrometers at the present time. Light has been used almost exclusively until the present time in the lithographic process. However, optical resolution limits make further advances much more difficult. The thrust today is to non-light lithography, and in particular to electron beam and X-ray exposure processes to achieve the higher packing densities required for the future. These problems and their possible solutions are discussed in greater detail by B. L. Critchlow in the publication entitled, "High Speed MOSFET Circuits Using Advanced Lithography", published in the Computer, Volume 9, No. 2, February 1976, pages 31 through 37. In that publication the substantial equipment cost and complexities of X-ray and electron beam lithography are described. However, up until now it has been believed that these were the only alternatives to optical projection printing for high complexity integrated circuit devices of the future.

There have been other efforts to obtain narrow line widths in the range of 1 micrometer or less by extending standard photolighography techniques and avoiding the need to use the more expensive and complex techniques such as electron beam or X-ray lithography. One such technique is described by H. B. Pogge in IBM Technical Disclosure Bulletin, November 1976, Volume No. 6, entitled "Narrow Line Widths Masking Method." This method involves the use of a porous silicon followed by oxidation of the porous silicon. Another technique is described by S. A. Abbas, et al, IBM Technical Disclosure Bulletin, Volume 20, No. 4, September 1977, pages 1367 through 1378. This TDB describes the use of polycrystalline silicon masking layers which are made into masks by first using an intermediate mask of oxidation blocking material, such as silicon nitride in the formation of the polycrystalline silicon. Line dimensions below about 2 micrometers may be obtained by this technique.

Plasma or reactive ion etching is a technique which has been developed for etching metals, semiconductor materials and dielectrics in the manufacture of integrated circuit devices. In particular, the method of reactive ion etching which is capable of doing anisotropic etching wherein very high aspect ratios can be obtained, that is the ratio of vertical etching is much greater than the horizontal etching. The process involves the use of a plasma or ionized gas containing a variety of highly reactive particles such as ions, free electrons and free radicals. The plasmas used in etching may be maintained at relatively low temperatures of the order up to 250° C. and low pressures in the range of 0.005 to 20 torr. The particles in the plasma are largely free radicals which cause the plasmas intense reactivity. The ion population in low temperature plasma is of the order of one percent of the particles. "A Survey of Plasma-Etching Processes" by Richard L. Bersin published in Solid State Technology, May 1976, pages 31 through 36 in great detail describe the plasma etching process and its application to semiconductor materials. The process has been used to make trenches or openings in silicon semiconductor bodies of various patterns as shown by Arthur K. Hochberg, U.S. Pat. No. 3,966,577 issued June 29, 1976; J. A. Bondur patent application Ser. No. 824,361 filed Aug. 15, 1977, now U.S. Pat. No. 4,104,086, and assigned to the assignee of the present patent application; and J. A. Bondur, et al, patent application Ser. No. 832,856 filed Sept. 13, 1977, now U.S. Pat. No. 4,139,442, assigned to the assignee of the present patent application. Further information about the process for reactive ion or plasma etching may be more fully understood by reference to the J. N. Harvilchuck, et al, patent application Ser. No. 594,413 filed July 9, 1975, now abandoned, and continuation patent application Ser. No. 822,775 filed Aug. 8, 1977, now abandoned. The RF induced plasma in the Harvilchuck, et al patent application is reactive chlorine, bromine or iodine specie. A precise description of the RF discharge apparatus and the processing is given in detail in that patent application.

A major problem in very dense integrated circuits is the electrical contacts to the various elements and devices in the silicon integrated circuits. It is necessary to have multilevels of metallurgy in the order of 2, 3, 4 or more levels of metallurgy to contact to the large number of devices within the integrated circuits. Further, it is necessary to electrically isolate each of these conductors in the multilayer conductive structures from one another. The buildup of these multilayer conductive structures on the surface of the silicon body present planarity problems for the lithography process steps which can cause defects in the structures through incomplete exposure of the lithographic layers. Examples of multilayer conductive structures in integrated circuits using highly doped polycrystalline silicon as the conductive layers may be seen in the R. C. Wang U.S. Pat. No. 3,750,268 issued Aug. 7, 1973; R. T. Simko, et al, U.S. Pat. No. 3,984,822 issued Oct. 5, 1976; R. T. Simko, et al, U.S. Pat. No. 3,996,657 issued Dec. 14, 1976; J. M. Caywood, U.S. Pat. No. 3,943,543 issued Mar. 9, 1976; and L. R. Walsh U.S. Pat. No. 4,097,885 issued June 27, 1978.

In the usual methods for forming double polycrystalline silicon multilayer structures, silicon dioxide is used as the insulator between the layers. The silicon dioxide thickness between two polycrystalline layers is normally directly related to the thickness of the silicon gate oxide where a FET type device is being made. The usual thermal oxidation is used to form the silicon dioxide thickness. It is the object of the invention to provide methods for forming an insulator of any desired thickness between the conductive layers and, in particular, on the vertical regions between the layers of conductive material.

SUMMARY OF THE PRESENT INVENTION

In accordance with the present invention, a method for forming an insulator between conductive layers is described wherein conductive material regions having substantially horizontal surfaces and substantially vertical surfaces are formed on the monocrystalline silicon body. A conformal insulator layer is formed on both the substantially horizontal surfaces and the substantially vertical surfaces.

The thickness of the insulator layer is the desired thickness of the insulator on the substantially vertical surfaces between the conducting layers to be formed. The structure is placed in a reactive ion etching ambient where the insulator layer is substantially removed from the horizontal surfaces and has no significant effect on the insulator on the vertical region of the silicon body. A conductive layer is then formed over the vertical insulator. The conductive metal material regions and the conductive layer are both preferably polycrystalline silicon.

High density bipolar integrated circuit devices having an insulator between conductive layers may be manufactured according to the present technique wherein a silicon body having a pattern of monocrystalline silicon regions isolated from one another is used. A base region is formed in certain of the monocrystalline regions. An insulator is formed over the surface of the silicon body having a pattern with openings for the base contacts to the base regions therein. A layer of polycrystalline silicon is deposited over the insulator. An insulator coating is formed on top of the polycrystalline layer. This insulator coating and polycrystalline layer is removed at the locations where the emitter and collector reach-through are to be formed. The remaining regions of the polycrystalline layer has substantially horizontal surfaces and substantially vertical surfaces. A conformal insulator layer is formed on both the substantially horizontal surfaces and substantially vertical surfaces. The structure is placed in the reactive ion etching ambient for the conformal insulating layer to substantially remove the horizontal conformal insulating layer and to provide a narrow dimensioned vertical insulating region on the polycrystalline layer. The emitter and collector reach-through regions within the monocrystalline silicon regions are formed by conventional diffusion or ion implantation techniques. A conductive layer is formed over the vertical insulating region and the insulator coating on the surface of the polycrystalline regions. The resulting bipolar integrated circuit has vertical insulating regions tailored to the desired thickness by the choice of the thickness of the conformal coating.

Field effect device integrated circuit structures may be similarly fabricated. A first insulator layer having the desired thickness of the gate insulator is formed on the surface of a monocrystalline silicon body. A first polycrystalline silicon layer is deposited over the first insulator layer. A second insulator layer is formed on the surface of the first polycrystalline silicon layer. The second insulator layer and the first polycrystalline silicon layer are removed from portions of the first insulator layer to form the gate electrode and which results in regions of the polycrystalline layer having substantially horizontal surfaces and substantially vertical surfaces. A conformal insulating layer on both the substantially horizontal surfaces and substantially vertical surfaces is deposited. The structure is placed in the reactive ion etching ambient for the conformal insulating layer to substantially remove the horizontal conformal insulating layer and to provide a narrow dimensioned vertical insulating region on the polycrystalline layer. A second polycrystalline silicon layer is deposited over the vertical insulating region. A third insulator layer is formed over the second polycrystalline layer. layer. A second insulator layer is formed on the surface of the first polycrystalline silicon layer. The second insulator layer and the first polycrystalline silicon layer are removed from portions of the first insulator layer to form the gate electrode and which results in regions of the polycrystalline layer having substantially horizontal surfaces and substantially vertical surfaces. A conformal insulating layer on both the substantially horizontal surfaces and substantially vertical surfaces is deposited. The structure is placed in the reactive ion etching ambient for the conformal insulating layer to substantially remove the horizontal conformal insulating layer and to provide a narrow dimensioned vertical insulating region on the polycrystalline layer. A second polycrystalline silicon layer is deposited over the vertical insulating region. A third insulator layer is formed over the second polycrystalline layer. The third insulator layer and the second polycrystalline silicon layer are removed in the desired pattern to connect the field effect devices in the integrated circuit. The second insulator layer and the first polycrystalline silicon layer are removed in the areas where diffused regions are required for the field effect devices and that diffusion or ion implantation is done to form the diffused regions. Again, a specifically tailored narrow dimensioned vertical insulating region is formed by this method between the polycrystalline silicon layers.

DISCLOSURE OF THE INVENTION

Figure 1:
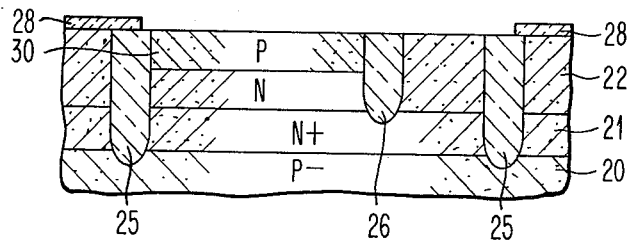
FIGS. 1 through 5 show the formation of an insulator between conductive layers for a bipolar type of integrated circuit.

Referring now more particularly to FIGS. 1 through 5, the manufacturing steps for a bipolar transistor utilizing the present method for forming an insulator between conducting layers is described. FIG. 1 illustrates one small, greatly enlarged portion of a silicon body which will be used to form a very dense bipolar integrated circuit. A P− substrate of monocrystalline silicon 20 has a blanket subcollector N+ diffusion 21 made therein. An epitaxial N layer 22 is then grown on top of the substrate. These processes are standard processes in the formation of, for example, NPN bipolar transistors. The substrate is typically a <100> crystallographic orientation silicon wafer having a resistance of the order of 1 to 20 ohm-cm. The subcollector diffusion is typically formed using arsenic having a surface concentration of about $10^{20}$ atoms/cm$^3$. The epitaxial growth process to form layer 22 may be by conventional techniques, such as the use of $SiCl_4/H_2$ or $SiH_4/H_2$ mixtures at temperatures about 1000° C. to 1200° C. During the epitaxial growth the dopant in the N+ layer moves into the epitaxial layer. The thickness of the epitaxial layer for highly dense integrated circuits is of the order of 3 micrometers or less. A mask, such as a thermally grown silicon dioxide layer (not shown), is formed on the surface of the epitaxial layer 22 and by suitable photolighographic and etching techniques mask openings are formed therein.

The next series of steps involves the formation of isolation means for isolating regions of monocrystalline silicon from other regions of monocrystalline silicon. The isolation may be by back biasing PN junctions, partial dielectric isolation or complete dielectric isolation. The dielectric materials used may be silicon dioxide, glass, etc. The preferred isolation for highly dense integrated circuits is dielectric isolation. The FIG. 1 shows partial dielectric isolation with dielectric regions 25 isolating monocrystalline silicon regions of the silicon body from one another and a region 26 which isolates the base emitter region from the collector reach-through region. There are many ways in the art to form dielectric regions of this type. It is preferred to use the process described in the J. A. Bondur, et al patent application Ser. No. 824,361 filed Aug. 15, 1977, and assigned to the assignee of the present patent application. In that patent application the process for forming partial dielectric isolation for regions 25 and 26 is described in detail.

An insulating layer 28 which may be thermally grown silicon dioxide is formed on the surface of the silicon body. This insulating layer may be alternatively one or a combination of known insulating materials such as silicon nitride, aluminum trioxide, or the like, in addition to thermally grown silicon dioxide. The insulating layer 28 where it is silicon dioxide may be thermally grown in an oxygen or oxygen-water vapor ambient at a temperature of about 970° C. A second method for growing silicon dioxide involves the use of a chemical vapor deposition process wherein $SiH_4$, $O_2$ at about 450° C.; or $SiH_2Cl_2$, $N_2O$ at a temperature of about 800° C. under atmospheric or low pressure conditions. The deposition of silicon nitride is usually formed by chemical vapor deposition using the following process conditions: $SiH_4$, $NH_3$ and $N_2$ carrier gas at a temperature of about 800° C. under atmospheric or low pressure conditions as discussed in the V. Y. Doo U.S. Pat. No. 4,089,992.

Standard photolithography and etching techniques are utilized to make openings in the insulating layer 28. The openings in layer 28 are located where it is desired to have the base region for bipolar transistors. The present process is now described for manufacturing a NPN bipolar transistor. Alternatively, a PNP transistor can be made by simply reversing the conductivities of the regions. Where an NPN transistor is to be made, the P type base region is formed by conventional diffusion or ion implantation techniques. The base region is 30. It is preferred that the base region abut the dielectric isolation regions, as shown in the drawing. The layer 28 is then removed over the regions planned to be collector reach-through by the usual lithography and etching techniques to produce to FIG. 1 structure. A coating 32 of P doped polycrystalline silicon is now deposited over the entire wafer by using a mixture of silane and diborane in a hydrogen ambient in temperature range of 500° to 1000° C. Alternatively, the polycrystalline silicon can be deposited and then doped by an ion implantation process. Other P type dopants can be alternatively used. The operative thickness of the polycrystalline silicon is between 1000 to 10,000 Angstroms with 4000 Angstroms preferred. Should the thickness be greater than about 10,000 Angstroms, planarity problems arise and make it difficult to fabricate high circuit density chips. If the thickness is less than about 1000 Angstroms, the resistance of the polycrystalline silicon layer becomes significant to adversely affect the performance of the device. The preferred doping level is between about $10^{19}$ to $10^{21}$ atoms/cm$^3$. The polycrystalline silicon makes an electrical contact to the base region and all other areas are formed on top of the silicon dioxide mask layer 28. Photolithography and etching techniques are utilized to remove the polycrystalline silicon layer 32 in areas where the collector reach-through is designated. Polycrystalline silicon layer 32 can be removed in, for example, the wiring channels or where Schottky barrier devices are wanted.

The structure is placed in an oxygen or oxygen-water vapor ambient to form the silicon dioxide layer 34 on the surface of the polycrystalline silicon. The thermal oxidation process typically involves a temperature of 970° C. Standard photolithography and etching techniques may be utilized to form openings in this silicon dioxide layer 34 over the areas which are designated to be the emitter areas and the collector reach-through areas. The thickness of the silicon dioxide mask is typically 2000 to 20,000 Angstroms. The structure is placed in a reactive ion or plasma etching environment for a polycrystalline silicon having typically the conditions as follows: for example, $Cl_2$-Argon or $CCl_4$-Argon, RF parallel plate structure about 10 microns pressure, 0.16 watts/cm$^2$ power density and 10 cc/minute flow rate and using the apparatus described in Harvilchuck, et al patent application mentioned above. The reactive ion etching process is completed when the monocrystalline silicon region is reached.

Figure 2:
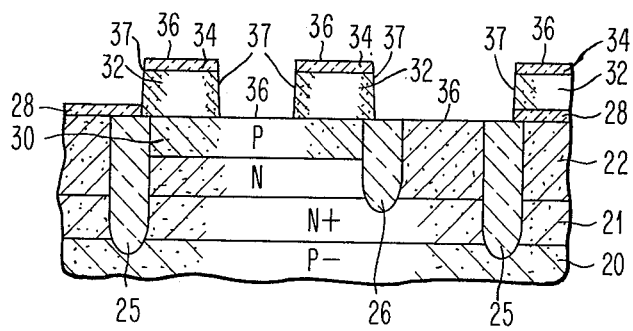

The resulting structure is shown in FIG. 2 wherein the emitter window and the collector reach-through window produces regions in the silicon structure having horizontal surfaces 36 and vertical surfaces 37. A conformal insulator layer 38 is deposited on both the substantially horizontal surfaces 36 and the substantially vertical surfaces 37. This layer 38 is typically formed by chemical vapor deposition. This conformal insulator layer may be one of several insulating materials, such as silicon dioxide, silicon nitride, aluminum oxide and combinations of these materials.

Figure 3:
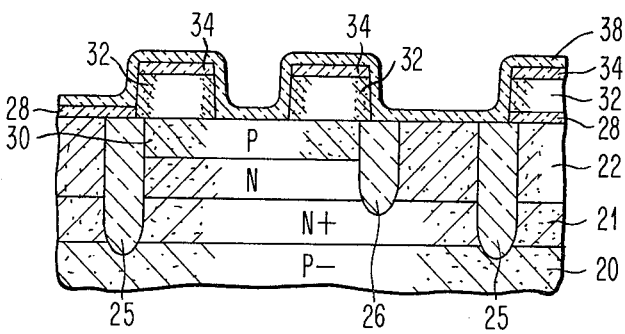

FIG. 3 shows the result of this step. The thickness of the conformal layer 38 is chosen for device design purposes such as the emitter-base separation. The thickness of the conformal insulator layer is between about 500 to 20,000 Angstroms and preferably 4000 Angstroms. The thickness may depend upon the particular insulator used. Where the thickness is greater than 20,000 Å longer etching times are required. Where the thickness is less than 500 Å shorting of emitter contact to the polycrystalline silicon or base region would arise.

Figure 4:
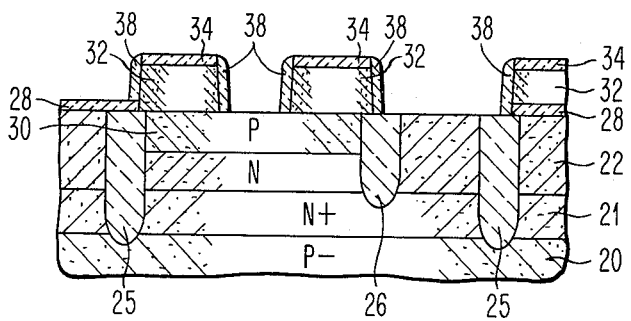
Figure 5:
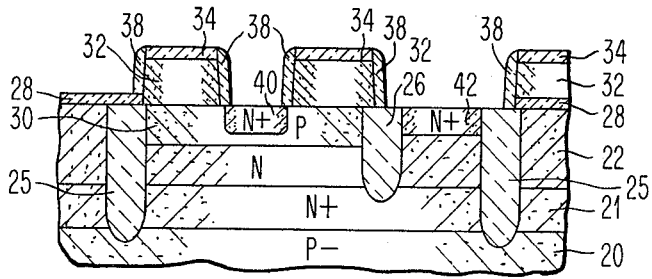

The FIG. 3 structure is placed into a suitable reactive ion etching ambient for the material of layer 38. For example, in etching silicon dioxide, the conditions are such that an etch ratio of about 10/1 ($SiO_2$)/(Si) is desirable. Over etching is needed to be sure $SiO_2$ is removed and/or etch stop indicator is used. The reactive ion etching process substantially removes the horizontal portion of layer 38 and provides the narrow dimensioned vertical region on the silicon body which is shown in FIG. 4.

The next step is to provide the emitter 40 and collector reach-through 42 regions. Where it is desired to form the N+ emitter region 40 and collector reach-through region 42 by means of thermal diffusion, the reactive ion etching of layer 38 is accomplished all the way down to the bare silicon surface and the thermal diffusion process for an N type impurity, such as arsenic or phosphorus under the usual conditions for making emitter diffusions and depending on the desired emitter depth and, for example, an arsenic capsule at 1050° C. may be utilized. Where it is desired to ion implant impurities into the body to form the emitter region 40 and collector reach-through region 42, it is preferable to implant these impurities through a thin insulating screen layer. The formation of this screen is accomplished simply by allowing the reaction ion etching to remove the insulator from the horizontal surfaces, except for a thin screen layer (not shown). Alternatively, the insulator is completely removed and a thin silicon dioxide is grown to form the screen. The structure is then placed in ion implantation apparatus wherein ions and other desired impurities such as arsenic or phosphorus, or the like, pass through the screen layer (not shown) to form the diffused regions 40 and 42. The conditions of such an ion implantation process are a $10^{16}$ atoms/cm$^3$ dose of arsenic at 100 KeV power. A drive-in step involves a temperature of about 1050° C. in an oxidizing atmosphere. The metallization and formation of electrical contacts may be accomplished by P+Si contact formation, Al evaporation, lithography and etching to form the desired conductor pattern on the surface of the integrated circuit.

Figure 6:
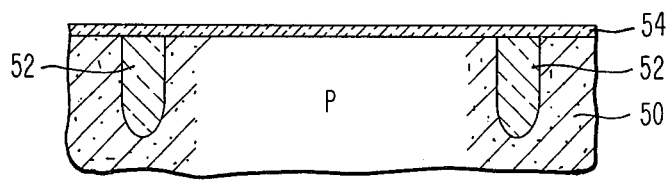
FIGS. 6 through 13 illustrate a method for forming an insulator between conductive layers for a FET random access memory (RAM) type of integrated circuit.

Referring now to FIGS. 6 through 13, a field effect memory integrated circuit of the random access memory (RAM) type is described. FIG. 6 shows a P type substrate 50 having a 10 ohm-cm resistivity. The substrate is divided into regions by dielectric isolation pattern 52. The regions are designated to be each single cell of a random access memory integrated circuit. The field effect gate insulator layer 54 is deposited over the surface of the body 50. The gate insulator 54 of the FET integrated circuit structure may be composed of a variety of insulators which include silicon dioxide and silicon nitride and combinations of these insulators. However, it is preferred that the insulator be silicon dioxide and that it is formed by means of thermal oxidation. The thickness of the gate insulator is preferred to be less than about 1000 Angstroms.

Figure 7:
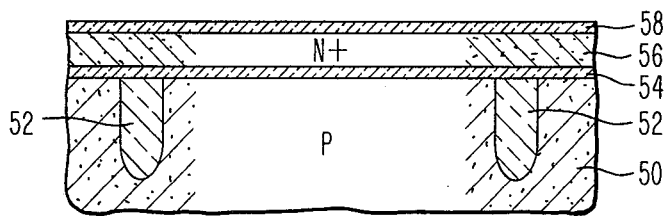
Figure 8:
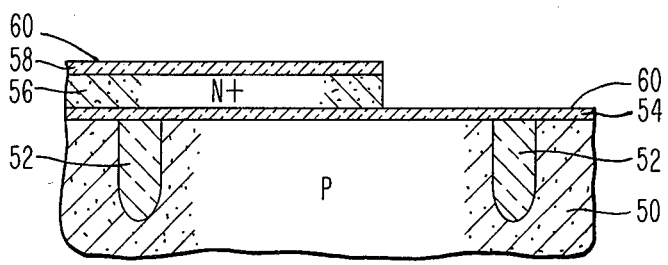
Figure 9:
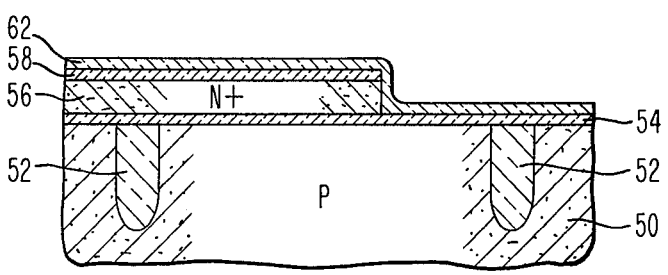
Figure 10:
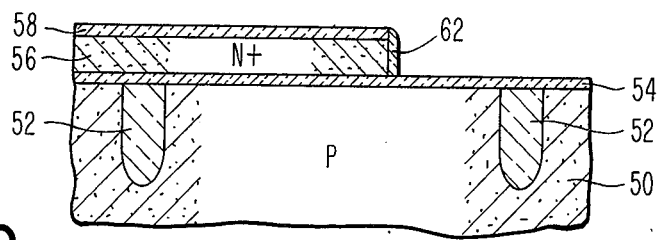
Figure 11:
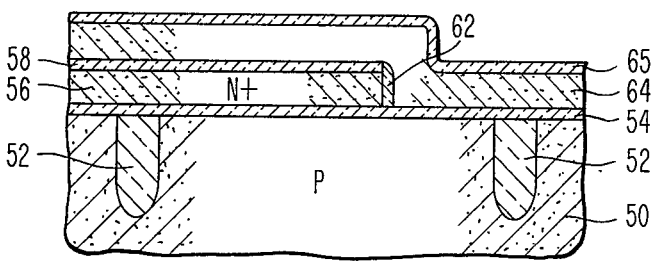
Figure 12:
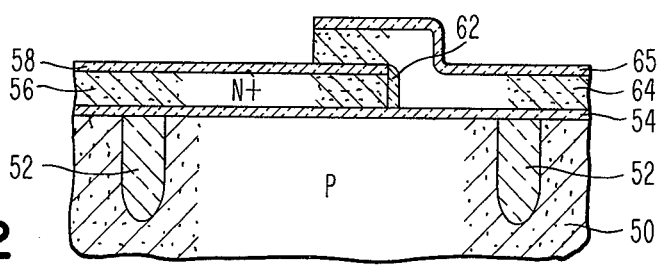

A first layer 56 of polycrystalline silicon is deposited over the gate oxide layer 54. The polycrystalline silicon is N+ doped with phosphorus. The polycrystalline silicon is deposited by means of chemical vapor deposition from $SiH_4$ reduction at about 600° C. under atmospheric or low pressure conditions. The thickness of the polycrystalline silicon is between about 1000 to 10,000 Angstroms and preferably 4000 Angstroms. The structure is then placed in an oxygen or oxygen-water vapor ambient at 970° C. and a thermally grown second silicon dioxide insulator layer 58 is formed upon the polycrystalline layer 56. Alternatively, the silicon dioxide may be formed by means of chemical vapor deposition. The resulting structure is shown in FIG. 7. Openings are formed in the second insulator layer 58 by standard photolithography and etching techniques. The openings are located over areas in certain of the cells where the storage electrode will eventually be formed. The reactive ion etching process is utilized to etch the first polycrystalline layer 56 in the openings of the layer 58. The transfer electrode is partially defined by this reactive ion etching step. A further result of the reactive ion etching step is the substantially horizontal surfaces 60 and substantially vertical surfaces 61 on the semiconductor body, as shown in FIG. 8. A conformal insulating layer 62 is now deposited on both the substantially horizontal surfaces 60 and substantially vertical surfaces 61. This layer is an insulating layer and as described in the bipolar integrated circuit embodiment may be composed of a variety of insulating materials. Further the thickness of this layer defines the vertical insulator thickness between the layers of conductive material in the final field effect integrated circuit structure. The thickness is preferably between about 1000 to 5000 Angstroms. The thickness of the conformal insulating layer is preferably 2000 Angstroms. The reactive ion or plasma etching is accomplished for the specific insulator used to substantially remove the horizontal conformal insulating layer 62 while providing a narrow dimensioned vertical insulting region on the first polycrystalline silicon layer 61. The result is shown in FIG. 10. A second polycrystalline silicon layer or similar conductive material 64 is deposited over the vertical insulating region 62 and the insulating layer 58 which cover the first polycrystalline silicon layer 56. A third insulator layer 65 is formed on the surface of the second polycrystalline silicon layer 64 by similar techniques as described above.

Figure 13:
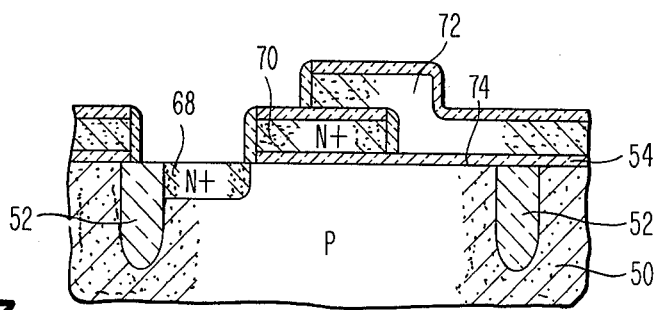

A portion of the third insulator layer 65 and second polycrystalline silicon layer 64 are removed in the desired pattern to connect the field effect devices in the integrated circuit structure. The second insulating layer 58 and first polycrystalline silicon layer 56 are also removed by suitable etching techniques in the desired patterns to obtain openings down to the silicon body 50 where it is desired to form diffused regions for the field effect devices of the integrated circuit. Then, as shown in FIG. 13, the N+ diffused region 68 for the storage cell is formed. This region 68 may alternative be formed by ion implantation through a screen silicon dioxide as described above.

The structure of FIG. 13 is formed in the example as a random access memory field effect transistor device. The diffused region 68 is connected as the bit line. The silicon gate electrode is 70 which is also connected as the word line. The field effect transistor channel is under the gate region 70. The polycrystalline region 72 acts as one electrode for the capacitor 74 of the storage cell while the substrate acts as the other electrode for the capacitor. The electrode 72 is connected to a DC source.

The silicon dioxide in the transfer region may be of different thickness than the silicon dioxide in the storage region. This can be accomplished by, for example, in FIG. 7 grow a substantially thicker silicon dioxide layer 58 than in layer 54. In FIG. 8 the layers 54 and 58 are subjected to reactive ion etching until the exposed layer 54 is removed. Some of the silicon dioxide layer of 58 is also removed, but sufficient silicon dioxide is present to provide its function. Then the silicon dioxide layer 54 is reformed to the desired thickness by conventional means.

The method can be used whenever it is desired to uncouple the thickness of the vertical insulating layer from the horizontal insulating layer present on the surface of a silicon integrated circuit. The method can find uses in, for example, charge coupled device and FET logic integrated circuits.

While the invention has been particularly shown and described with reference to the preferred embodiments thereof, it will be understood by those skilled in the art that various changes in form and detail may be made therein without departing from the spirit and scope of the invention.

Having thus described my invention, what I claim as new, and desire to secure by Letters Patent is:

1. A method for forming an insulator between conducting layers comprising:
   providing a monocrystalline silicon body;
   forming above the surface of said body conductive material regions having substantially horizontal surfaces and substantially vertical surfaces and having an insulation layer on the said horizontal surfaces;
   forming a conformal insulator layer on both said substantially horizontal surfaces and said substantially vertical surfaces;
   reactive ion etching said insulator layer to substantially remove said horizontal layer and to provide a narrow dimensioned vertical insulator region on said silicon body while leaving said insulation layer substantially intact; and
   forming a conductive layer over said vertical insulator.

2. The method of claim 1 wherein the said conductive material regions are composed of polycrystalline silicon for the contact to the base regions of bipolar transistors.

3. The method of claim 2 wherein said polycrystalline layer is P type and said transistors are NPN.

4. The method of claim 1 wherein said conductive layer is composed of polycrystalline silicon.

5. The method of claim 2 or 3 where said insulation layer is composed of silicon dioxide.

6. The method of claim 1 wherein a bipolar integrated circuit is within said body and is interconnected by means of said conductive material regions and said conducting layer.

7. The method of claim 1 wherein a field effect transistor is within said body and interconnected by means of said conductive material regions and said conducting layer.

8. A method for forming bipolar integrated circuit devices having an insulator between conducting layers comprising:
   providing a silicon body having a pattern of monocrystalline silicon regions isolated from one another;
   forming a base region in said monocrystalline regions;
   providing an insulator over the surface of said body having said pattern with openings for the base contacts to said base regions;
   despositing a layer of polycrystalline silicon over said insulator and said openings therein;
   forming an insulator coating upon said polycrystalline silicon layer;
   removing said insulator coating and said polycrystalline silicon layer from where said emitter and collector reach-through are to be formed which results in regions of said polycrystalline layer with said insulator coating thereon having substantially horizontal surfaces and substantially vertical surfaces;
   forming a conformal insulating layer on both said substantially horizontal surfaces and said substantially vertical surfaces;
   reactive ion etching said conformal insulating layer to substantially remove said horizontal conformal insulating layer and to provide a narrow dimensioned vertical insulating region on said polycrystalline layer;
   forming the emitter and collector reach-through regions within said monocrystalline silicon regions; and
   forming a conductive layer over said vertical insulating region and said insulator coating.

9. The method of claim 8 wherein the said conducting layer is polycrystalline silicon.

10. The method of claim 8 wherein said insulator, insulator coating and conformal insulating layer are silicon dioxide.

11. The method of claim 10 wherein said insulator and insulator coating are thermally grown silicon dioxide and said conformal insulating layer is chemically deposited silicon dioxide.

12. The method of claim 8 wherein said polycrystalline layer is P doped and makes contact to said base region which is P type.

13. The method of claim 8 wherein said monocrystalline silicon regions are isolated from one another by dielectric isolation.

14. The method of claim 13 wherein the said base region is isolated from said collector reach-through region by dielectric isolation.

15. The method of claim 8 wherein the said conformal insulating layer and narrow dimensioned vertical insulating region are between about 1000 and 10,000 Angstroms in thickness.

16. A method for forming a field effect device integrated circuit structure comprising:
   providing a monocrystalline silicon body;
   forming a first insulator layer having the desired thickness of the gate insulator on the surface of said body;
   forming a first polycrystalline silicon layer over said insulator layer;
   forming a second insulator layer on the surface of said first polycrystalline silicon layer;
   removing said second insulator layer and said first polycrystalline silicon layer from portions of said first insulator layer to form part of the gate electrode and which results in regions of said polycrystalline layer with said second insulator layer thereon having substantially horizontal surfaces and substantially vertical surfaces;
   forming a conformal insulating layer on both said substantially horizontal surfaces and said substantially vertical surfaces;
   reactive ion etching said conformal insulating layer to substantially remove said horizontal conformal insulating layer and to provide a narrow dimensioned vertical insulating region on said polycrystalline layer;

forming a second polycrystalline silicon layer over said vertical insulating region, said exposed first insulator layer and said second insulator layer;

forming a third insulator layer on said second polycrystalline layer;

removing said third insulator layer and said second polycrystalline layer in the desired pattern to connect the said field effect devices in said integrated circuit;

removing said second insulator layer and said first polycrystalline layer in the areas where diffused regions are required for said field effect devices and to fully define the said gate electrode pattern; and forming said diffused regions.

17. The method of claim 16 wherein a random active memory integrated circuit structure is formed, the said gate electrode is a transfer electrode and word line, said removing said third insulating layer and said second polycrystalline forms the storage electrode, and the said diffused regions is the bit line.

18. The method of claim 16 wherein a charge coupled device integrated circuit structure is formed.

19. The method of claim 16 wherein said first, second and third insulator layer are thermally grown silicon dioxide and said conformal insulating layer is chemically deposited silicon dioxide.

20. The method of claim 16 wherein the diffused regions are N+.

21. The method of claim 16 wherein said monocrystalline silicon body is divided into a pattern monocrystalline regions by a pattern of dielectric isolating regions and said field effect device formed in certain of said regions.

22. The method of claim 21 wherein said dielectric isolating regions are composed of silicon dioxide.

23. The method of claim 16 wherein the said conformal insulating layer and said narrow dimensioned vertical insulating region are between about 1000 to 5000 in thickness.

* * * * *